United States Patent [19]
Hazen et al.

[11] Patent Number: 5,379,413
[45] Date of Patent: Jan. 3, 1995

[54] USER SELECTABLE WORD/BYTE INPUT ARCHITECTURE FOR FLASH EEPROM MEMORY WRITE AND ERASE OPERATIONS

[75] Inventors: Peter K. Hazen, Sacramento; Sanjay S. Talreja, Citrus Heights; Rodney R. Rozman, Placerville, all of Calif.

[73] Assignee: INTEL Corporation, Santa Clara, Calif.

[21] Appl. No.: 901,396

[22] Filed: Jun. 19, 1992

[51] Int. Cl.⁶ .............................................. G06F 11/00
[52] U.S. Cl. .................................. 395/575; 371/21.2; 371/71
[58] Field of Search ................. 371/21.2, 71, 24, 67.1; 395/578

[56]  References Cited
  U.S. PATENT DOCUMENTS

| | | |
|---|---|---|
| 4,672,583 | 6/1987 | Nakaizumi ........................ 371/21.2 |
| 5,132,853 | 7/1992 | Kulakowski et al. .............. 371/21.2 |
| 5,274,648 | 12/1993 | Eikill et al. ........................ 360/48 |

OTHER PUBLICATIONS

*Dictionary of Computers, Information Processing & Telecommunications* by Jerry M. Rosenberg ℗1987 by John Wiley & Sons, Inc., p. 513.

*Advanced Microprocessors* by Daniel Tabak ℗1991 by McGraw-Hill, Inc. pp. 41–59.

Primary Examiner—Vincent P. Canney
Attorney, Agent, or Firm—Blakely, Sokoloff, Taylor & Zafman

[57] ABSTRACT

A circuit for accessing data which may be stored in a flash EEPROM memory array in sixteen bit quantities has apparatus for writing data to the array in eight bit quantities which quantities may be either the lower or upper byte of a word and appear at identical input terminals, apparatus for writing data to the array in sixteen bit quantities, apparatus for reading data from the array to identical output terminals in eight bit quantities which quantities may be either the lower or upper byte of a word, and apparatus for reading data from the array in sixteen bit quantities. The circuit also has apparatus for reading data from the array in eight and sixteen bit quantities during periods in which an erase operation conducted on sixteen bits is suspended.

29 Claims, 3 Drawing Sheets

USER SELECTABLE WORD/BYTE INPUT ARCHITECTURE FOR FLASH EEPROM MEMORY WRITE AND ERASE OPERATIONS

BACKGROUND OF THE INVENTION

1. Field Of The Invention

This invention relates to flash electrically-erasable programmable read-only memory (flash EEPROM) memory arrays and, more particularly, to methods and apparatus for allowing the reading from or writing to such a memory array and the verification of programming and erase operations in such an array on either an eight or a sixteen bit basis.

2. History Of The Prior Art

Modern computer systems make extensive use of long term memory. One form of long term storage used in computers is flash EEPROM. A flash EEPROM memory array is an EPROM memory array which may be electrically erased in place and reprogrammed. A flash EEPROM memory array includes a large plurality of floating-gate field effect transistors arranged as memory cells in typical row and column fashion with circuitry for accessing the individual cells and placing the memory transistors of those cells in one of two memory conditions. A flash memory cell, like a typical EPROM cell retains information when power is removed.

Flash EEPROM memory has a number of characteristics which adapt it to use as long term memory. It is light in weight, occupies very little space, and consumes less power than electro-mechanical disk drives. More importantly, it is especially rugged. It will withstand without adverse effects repeated drops each of which would destroy a typical electro-mechanical hard disk.

A difficulty with flash EEPROM, however, is that it is very slow to erase. Flash EEPROM is erased by applying a high voltage simultaneously to the source terminals of all of the transistors (cells) used in the memory. Because these source terminals are all connected to one another by metallic busing in the array, the entire array must be erased at once. If any valid data remains in the array, it must be saved before erasure occurs and rewritten to the array after the array has been completely erased.

An arrangement has been devised to accomplish the programming, reading, and erasing of flash EEPROM memory arrays. This arrangement includes a command state machine which provides a command interface between the host computer and the flash EEPROM memory array. The command state machine receives and controls all instructions and data sent by the host computer to the flash memory array and all data and signals provided by the flash memory array for the host. The command state machine sequences the various information to and from the host using a write state machine to program and erase so that the writing to and reading from the array occurs in proper order. Because it sits between the host and the memory array and controls all information passed therebetween, the command state machine is able to control the erasure process so that the external host which is writing to and receiving information from the flash array is typically not aware that an erasure is taking place even though the erasure requires one or two seconds and includes a verification of the accuracy of the erasure. In order to accomplish this, the command state machine has the ability to suspend the erasure process in order to allow various commands from the host to be implemented. The details of the command state machine and the write state machine are described in U.S. patent application Ser. No. 07/655,643, entitled Command State Machine, Fandrich et al, filed Feb. 11, 1991, and assigned to the assignee of the present invention, and in U.S. patent application Ser. No. 07/654,375, entitled Circuitry and Method For Programming and Erasing A Non-volatile Semiconductor Memory, Kynett et al, filed Feb. 11, 1991, and assigned to the assignee of the present invention.

Flash EEPROM memory arrays, like other forms of long term memory, must read and write data which a host may desire or furnish in either byte or word form. The first flash EEPROM memory arrays carried out read and write operations involving only eight bit values and simply took longer to store and read word length values. More recently, arrays which may be written or read in sixteen bit quantities have been designed. With these arrays it is desirable to be able to read and write data, in not only in sixteen bit quantities, but also in eight bit quantities which may be either the high or low byte of a sixteen bit word.

Moreover, in order to complete the erase process of those sixteen bit arrays as fast as possible, it is desirable to verify the accuracy of the erasure sixteen bits at a time. However, because the erasure process takes so long in flash EEPROM memory arrays, it must be suspended frequently so that data may be read from the flash EEPROM memory. Often, only eight bits of data are to be read by the host computer. Consequently, it is desirable when erasing in the sixteen bit mode to be able to accomplish eight bit read operations of both the upper and lower eight bytes of words stored in the array.

Another especially valuable facility of the control circuitry of the eight bit flash EEPROM memory array (which includes the command and write state machines) is the ability to assure that any data written to the array is written correctly and that erasure has been accomplished successfully. In order to verify this, any data written to the array is latched and compared to the data which is expected to be written. It is desirable that this same facility be available to the array whether the data is being written in eight or sixteen bit quantities and whether eight bit quantities of data are written to either the high or the low order byte positions.

SUMMARY OF THE INVENTION

It is, therefore, an object of the present invention to provide for both sixteen and eight bit read and write operations and sixteen bit erase operations in a memory array arranged in row and column fashion.

It is another object of the present invention to allow eight bit read operations to be accomplished while a flash EEPROM memory array is the midst of erasing in a sixteen bit mode.

It is yet another object of the present invention to provide an arrangement by which all eight bit operations occur on the low order bits of the buses utilized by the control circuitry of a flash EEPROM memory array.

It is an additional object of the present invention to verify the success of write and erase operations as the operations occur in a flash EEPROM memory array.

These and other objects of the present invention are realized in a circuit for accessing data which may be stored in a flash EEPROM memory array in sixteen bit quantities including means for writing data to the array in eight bit quantities which quantities may be either the lower or upper byte of a word and appear at identical input terminals, means for writing data to the array in sixteen bit quantities, means for reading data from the array to identical output terminals in eight bit quantities which quantities may be either the lower or upper byte of a word, and means for reading data from the array in sixteen bit quantities. Other features of the invention include the ability to read data from the memory array in eight and sixteen bit quantities during periods in which a sixteen bit erase operation is suspended and to verify write operations which occur on both eight and sixteen bit bases.

These and other objects and features of the invention will be better understood by reference to the detailed description which follows taken together with the drawings in which like elements are referred to by like designations throughout the several views.

DETAILED DESCRIPTION OF THE INVENTION

Figure 1:
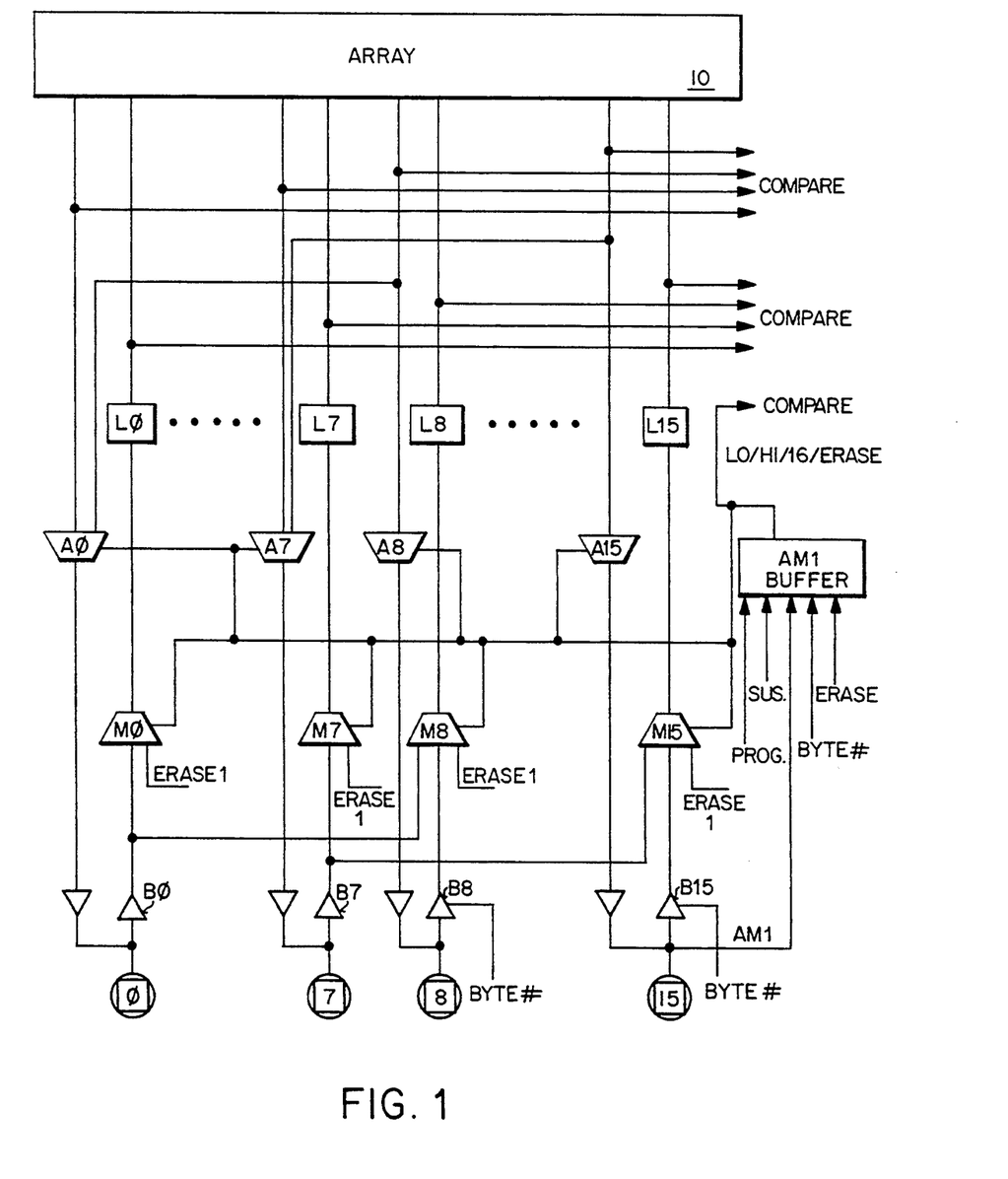
FIG. 1 is a block diagram illustrating a circuit designed in accordance with the present invention.

Referring now to FIG. 1, there is illustrated a block diagram of an arrangement in accordance with the present invention. The arrangement includes a memory array 10 which in the preferred embodiment is a flash EEPROM memory array such as that described above. As may be seen, input signals to the array 10 are furnished on a number of input/output terminals 0-15. This allows sixteen bit quantities of information to be transferred in parallel to and taken from the array 10 for storage in sixteen bit words within the array 10. This is the preferred manner of accessing the array.

However, many programs make use of eight bit transfers to and from memory arrays; and such transfers also need to be managed. The eight bits involved in these transfers may be either the upper or the lower bits of any particular sixteen bit word. In the system with which such circuitry is designed to function, the control circuitry causes both the high and low bytes of any word to appear on word boundaries. Consequently, when bits 0 through 7 of a sixteen bit word are to be written to the array 10 as a byte value, these bits will appear on input terminals 0-7. Similarly, when bits 8 though 15 of a sixteen bit word are to be written to the array 10 as a byte value, these bits will also appear on input terminals 0-7.

Within the array 10, however, the eight bits of each byte transferred to the array must be stored in their normal byte positions so that they may be accurately recalled when needed. This requires that the circuitry for accessing the array provide means for sensing the particular byte value being written to the array so that it may be placed in the appropriate byte position in a word stored in the array.

Similarly, when data is to be read from the array 10 on a byte basis, that data is stored within the array 10 in the correct byte position (i.e., bits 0-7 in bit positions 0-7 and bits 8-15 in bit positions 8-15 of each particular word). Consequently, when data is read in bytes from the array 10, it must be furnished on the output terminals 0-7 of the array 10 whether it is the upper or lower byte of the particular word; and circuitry must be provided for causing this to happen.

In a similar manner, data may be erased from the array in accordance with the erasure operation described above. In order to accelerate the erasure process, the hardware of the array and the associated control circuitry is adapted to cause the verification of the erasure to proceed at sixteen bits per word thereby reducing the time for the process to a minimum. However, since the erasure process may be interrupted (suspended) in order to allow data to be read from the array, provision must be made so that data may be read in whatever increment the program requires. Sometimes this increment is a byte; and the byte to be read may be either the low or the high byte of a word. If the erase process is to continue after the suspension condition is finished (which it must in order to assure that the valid data being rewritten to new areas of the array is not disturbed), then the circuitry must somehow allow read operations to occur on a high or a low byte basis while still assuring that the erase will continue on a sixteen bit basis once the erase resumes.

One of the features of the circuitry of a flash EEPROM memory array is that it compares the data written to the array with what was expected to be written to verify that data has been correctly written to the array. It also compares all of the memory cells of a newly erased array with the expected condition of erased cells to assure that each cell has been erased as expected. This helps to reduce the overall number of errors which can occur in flash EEPROM memory arrays in relation to other types of memory arrays. When the circuitry is adapted to write data in both eight and sixteen bit modes, the circuitry must be able to accomplish the comparison for all of the modes which are possible.

In FIG. 1, the input terminals 0-15 to the array 10 are connected to a number of input buffers B0-B15 The buffers transfer the input values furnished at the terminals 0-15 to the input to a number of multiplexors M0-M15. Each of these multiplexors M0-M15 is adapted to transfer the appropriate bit from the input terminals to the internal memory cells of the array 10 based on the particular mode of operation. For example, when data is written to the array 10 to program the memory cells in the sixteen bit mode, it is necessary that the data appearing at the input terminals 0-15 be transferred directly to the memory cells of the array 10 storing the bits 0-15. In the mode in which only the low byte is to be written to the array 10, the signals appearing on the terminals 0-7 should be transferred to the memory cells of the array representing bits 0-7. On the other hand, when the data is to be written to only the high byte of the array in the high byte mode, then the data appearing on the terminals 0-7 is data which (although word aligned to appear on the terminals 0-7) must be transferred to the memory cells of the array 10 representing bits 8-15.

To allow this to happen, the values transferred by the buffers B0-B7 are also connected to the inputs of the multiplexors M8-M15, respectively. Consequently, the multiplexors M0-M15 may perform the appropriate routing operation described above.

In order to cause this to occur, a signal BYTE# produced by the command interface circuitry indicates whether the operation to be performed is in the sixteen bit mode or one of the eight bit modes. If, in the preferred embodiment, the signal BYTE# is high, then the sixteen bit mode is indicated. If the signal BYTE# is low, one of the eight bit modes is indicated. When the signal BYTE# is low indicating an eight bit mode, it is accompanied by a signal AM1 from the command interface circuitry which indicates whether the operation involves the high or the low byte. In the preferred embodiment, the signal AM1 being low indicates a low byte operation while the signal AM1 being high indicates a high byte operation. This signal AM1 is transferred to the array 10 on the terminal 15 because that terminal is never used for data input in an eight bit mode since all eight bit values are word aligned and, consequently, appear on the terminals 0–7. The data input lines to the conductors connected to the external terminals 8–15 are therefore always switched off in the eight bit modes. This is accomplished by turning off (tristating) the buffers B8–B15 whenever the signal BYTE# is low. Thus, the input/output terminal 15 may be utilized to transfer the AM1 signal. This eliminates the need for an extra pin to transfer the byte mode signal AM1 to the array.

The signals AM1 and BYTE# are transferred to an AM1 input buffer where they generate signals which indicate the mode of operation. The AM1 buffer provides output signals signifying sixteen bit operation if the signal BYTE# is high. The AM1 buffer provides output signals indicating operation in the low byte mode if the signal BYTE# is low and the signal AM1 is low. The AM1 buffer provides output signals indicating operation in the high byte mode if the signal BYTE# is low and the signal AM1 is high. These signals are transferred to the multiplexors M0–M15 to select the particular mode of operation during programming. In the sixteen bit mode each of the multiplexors M0–M15 transfers the signal at the associated terminal 0–15 forwarded by the buffers B0–B15 to a set of latches L0–L15 and directly to the same memory cells of the array for bits 0–15. In low byte mode, the multiplexors 0–7 transfer the signals on the terminals 0–7 to the latches L0–L7 and to the memory cells for bits 0–7. In the high byte mode, the multiplexors 8–15 transfer the signals on the terminals 0–7 to the latches L8–L15 and to the memory cells for bits 8–15. This transfer occurs because the high byte signals which appear on the low byte terminals must be transferred to the high byte cells for storage in the memory array.

The latches L0–L15 are provided in the circuit to store the bit values written to the array 10 during programming so that the values expected to be written to the array 10 may be compared with the values actually written to the array 10 in a programming verification process.

During erase, the command interface produces a signal when the user submits an erase command to the system indicating that an erase operation should occur. This signal goes to the AM1 buffer which produces a signal indicating that an erase value of one is to be written to each of the sixteen lines of the internal busing paths. This signal causes each of the multiplexors to select a value of one provided at the input to each multiplexor 0–15. This condition of the multiplexors must be terminated during the erase suspend condition so that a read may be conducted in the appropriate eight or sixteen bit mode. This is accomplished within the AM1 buffer by the selection circuitry in a manner which will be discussed below. When in the erase suspend mode, the values of the BYTE# and AM1 signals again control which of the selection signals are produced by the AM1 buffer. In this manner, the controller circuitry may be erasing the array in sixteen bit erase mode, have its erase operation suspended, then conduct read operation during the suspension in the high and low byte modes as well as the sixteen bit mode, yet return to the sixteen bit erase mode when the suspension is complete. If this were not true, then only sixteen bit read operations could be conducted during the erase suspend interval since the erase process must be completed accurately in order to deal with any valid data which is stored in the array when the erase is suspended.

Also illustrated in FIG. 1 are a second set of multiplexors A0–A15. These multiplexors are utilized to read information from the memory array 10 in the read mode and to allow the values written to the array 10 and the cell condition of the array 10 immediately after an erase operation to be read to verify that the values written are those which were expected to be written during either the programming or erase operations. To this end, the memory cells of the array 10 may be connected through sense amplifiers (not shown) within the array as an input to the multiplexors A0–A15. Moreover, the sense amplifiers of the array 10 transferring data from the high byte positions 8–15 are also connected as inputs to each of the multiplexors A0–A7, respectively.

In a similar manner to the operation of the multiplexor M0–M15, the multiplexors A0–A15 function during a read operation in response to the mode selection signals generated by the AM1 buffer in reply to the AM1 and BYTE# input signals. In the sixteen bit mode of operation, the BYTE# signal being high causes the AM1 buffer to produce a signal causing the multiplexors A0–A15 to transfer data directly from the sense amplifiers handling bits 0–15 to the same output terminals 0–15. In the low byte mode, the mode selection signals cause the multiplexors A0–A7 transfer signals from the sense amplifiers handling bits 0–7 to the output terminals 0–7. On the other hand, in the high byte mode, the mode selection signals cause the multiplexors A0–A7 to transfer data from the sense amplifiers handling bits 8–15 to the output terminals 0–7 so that the high byte value will be properly aligned on a word boundary for use by the host.

Figure 2:
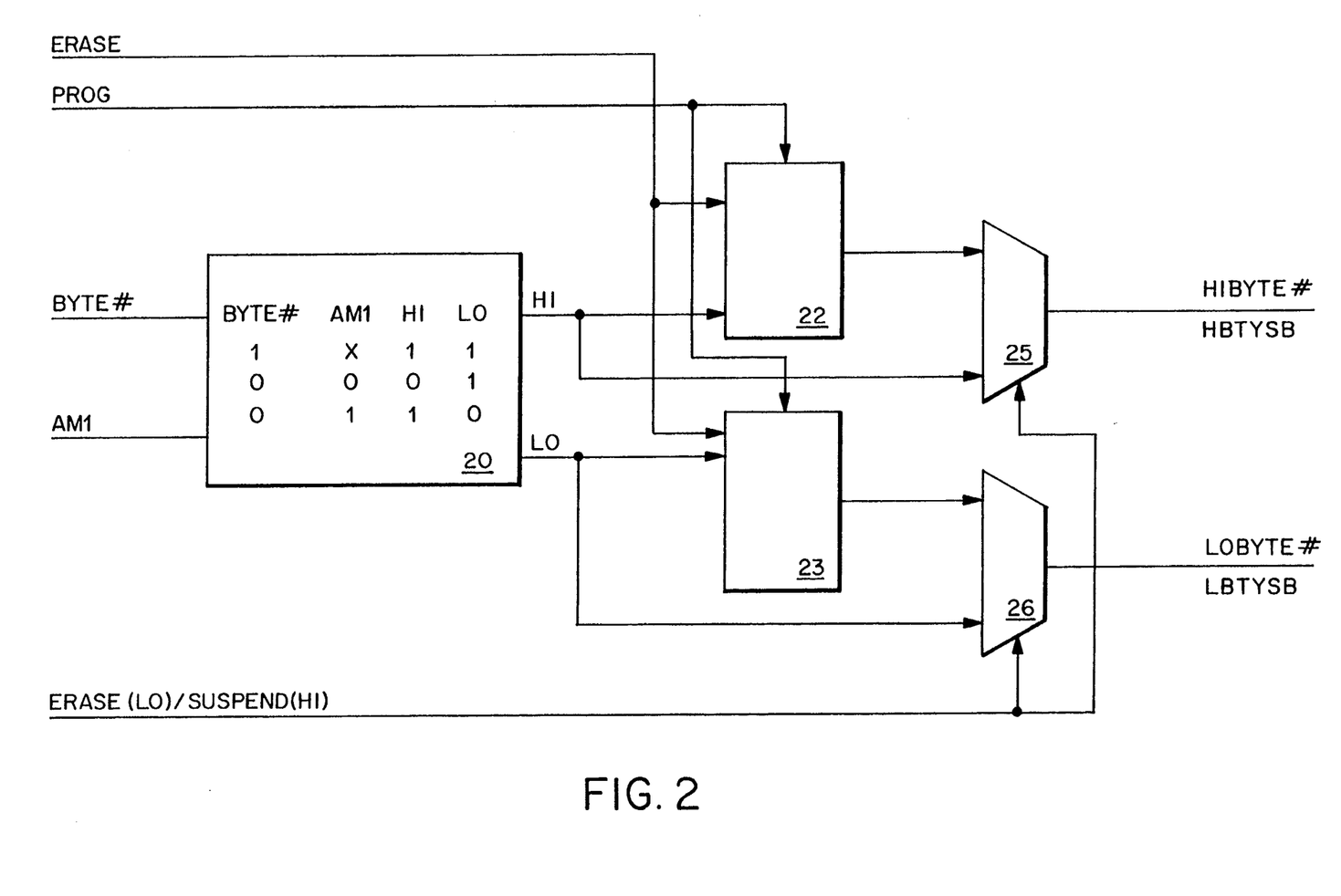
FIG. 2 is a block diagram illustrating in more detail the circuitry of a portion of the circuit of FIG. 1.

FIG. 2 illustrates in more detail the AM1 buffer by which the selection of a particular mode is accomplished. As may be seen, the AM1 buffer includes a logic circuit 20 which receives the input signals BYTE# and AM1. The logic circuit 20 produces a pair of output signals indicating the sixteen bit mode, the low byte mode, or the high byte mode depending on the condition of the two signals. These signals are transferred to the input terminals of a pair of latches 22 and 23. A latch enable signal is provided in the program (write) mode so that the two values appearing on the high and low byte input terminals from the logic circuit 20 to the latches 22 and 23 are latched during the programming condition. An ERASE signal appears on an input terminal erase during the erase condition and is furnished to force the latches 22 and 23 to the one condition when an erase occurs. Thus, the latches 22 and 23 both contain values indicating the sixteen bit mode during the sixteen bit program mode, contain a first set of one and zero states indicating the low byte mode during the low byte programming mode, contain the other set of zero and one states indicating the high byte mode during the high byte programming mode, and contain values indicating the sixteen bit mode during the erase mode.

Normally the values in the latches 22 and 23 are provided to the output terminals by a pair of multiplexors 25 and 26 as the signals HIBYTE# and LOBYTE# to indicate the mode of operation. Thus, a low value is provided as each of the output signals HIBYTE# and LOBYTE# to indicate the sixteen bit mode, a low value as the signal LOBYTE# and a high value as the signal HIBYTE# to indicate the low byte mode, a high value as the signal LOBYTE# and a low value as the signal HIBYTE# to indicate the high byte mode, and low values as both signals to indicate the sixteen bit erase mode.

However, an erase suspend signal occurring during the erase mode causes the multiplexors 25 and 26 to select input signals directly at the output of the logic circuit 20 and thus directly in response to the values on the input terminals BYTE# and AM1. Thus, while the erase condition forces a one value into each of the latches 22 and 23 to control the value of the two selection signals to indicate operation in the sixteen bit mode, the erase suspend signal causes the values on the output terminals of the AM1 buffer to be selected as the signals HIBYTE# and LOBYTE# instead. These may indicate that a read operation is to occur in the sixteen bit mode, the low byte mode, or the high byte mode. During the erase suspend mode, these selection signals affect which of the multiplexors A0–A15 is selected to transfer data from the array 10.

However, when the erase suspend operation is complete, tile values held in the latches 22 and 23 which indicate the sixteen bit erase mode are again transferred by the multiplexors 25 and 26 to indicate immediately that the erase operation is to continue in the sixteen bit mode of operation necessary to the fast erase operation.

Referring back to FIG. 1, the arrangement for latching data to be programmed in a flash EEPROM memory array is shown. The arrangement includes the eight individual latches L0–L7 which store the condition of the low bits of data written to a flash EEPROM array 10 when the array is programmed and the eight individual latches L8–L15 which store the condition of the high bits of data. In a sixteen bit write mode, the data bits which are stored in the latches L0–L15 are furnished on the terminals 0–15 and are transferred directly to the latches L0–L15 by the multiplexors M0–M7. In the low byte mode, the data bits which are stored in the latches L0–L7 are furnished on the terminals 0–7 and are transferred directly by the multiplexors M0–M7.

As was pointed out above, the multiplexors M8–M15 receive inputs from the buffers B0–B7 as well as the buffers B8–B15 so that they may select between information available on the low data bit input bus carrying the data bits 0–7 and the data appearing on the high data bit input bus carrying the data bits 8–15. This allows the latches L8–L15 to store the high byte of data when an eight bit high byte write operation is in process. It will be noted that since the buffers B8–B15 are off during any byte mode operation, no values are being furnished to the multiplexors M8–M15 in the high byte write mode. Thus, depending on the particular bit operation being conducted, the appropriate data bits are being stored in the latches L0–L15. The data bits in the latches L0–L15 are provided to a compare circuit 40 at the end of a write operation and are used to verify the write operation.

Figure 3:
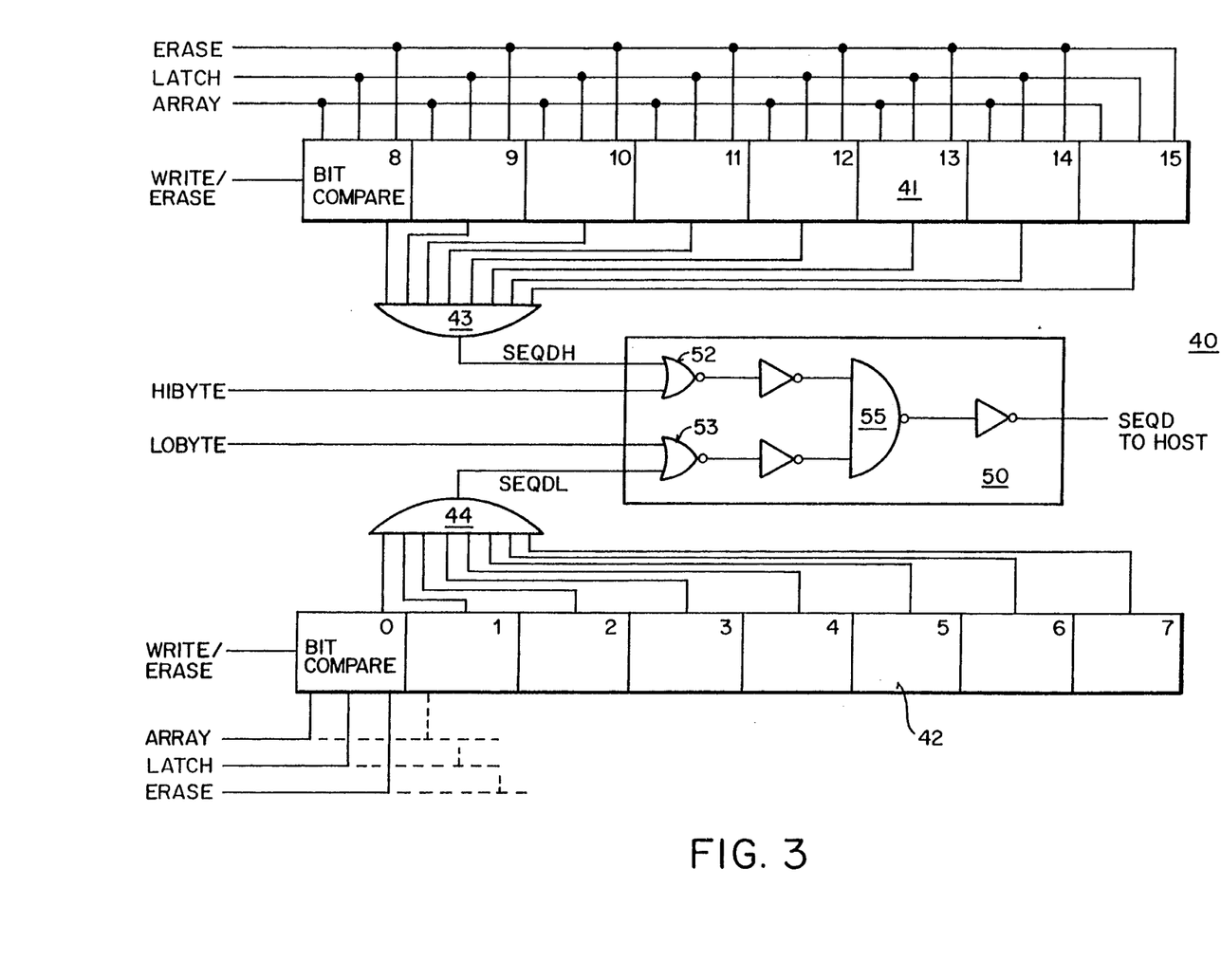
FIG. 3 is another circuit diagram illustrating the details of the circuit of FIG. 1.

FIG. 3 illustrates the operation of compare circuitry which ascertains that the value written to the array 10 is the same as the value expected to be written. The compare circuit 40 compares the state of each bit read from the array 10 after the completion of a programming operation with the state of the data bit expected to be written (which is stored in the latches L0–L15) using bit compare circuitry which is essentially an AND gate for each bit. The compare circuit 40 includes a circuit 41 for comparing each of the high order bits, a circuit 42 for comparing each of the low order bits, an AND gate 43 for providing a true output signal SEQDH when the high bits all compare, and a circuit 42 for comparing each of the low order bits, an AND gate 44 for providing a true output signal SEQDL when the low bits all compare. The data read from the array 10 after the completion of a programming operation is furnished by the multiplexors A0–A15 directly from the sense amplifiers handling bits 0–15 to the same output terminals 0–15. The data in the appropriate bits of the latches L0–L15 is also furnished to the compare circuit, and the results of each bit comparison are ANDed. In a similar manner, the compare circuit compares the state of each bit 0–15 read from the array 10 for each word stored in an erased block after the completion of an erase operation on that block with the data value expected, a one value. The data to be expected in the erase condition is provided by a signal CMPER which forces the input value to the comparators which is compared with the array data to be a one value. Presuming that all of the bits compare, the output signal SEQDL (for the low byte compare) or SEQDH (for the high byte compare) is produced indicating the entire byte compares. This occurs in all three of the modes of operation; but in the sixteen bit mode, both signals SEQDL and SEQDH are true.

In order to compare the correct data in the various modes of operation, a circuit 50 is utilized. The circuit 50 receives an input signal SEQDL which is low to indicate that the low bytes written compare with the low bytes latched (or erased), the signal SEQDH which is low to indicate that the high bytes written compare with the high bytes latched (or erased), a signal LOBYTE# indicating that the mode is the low byte mode, and a signal HIBYTE# indicating that the mode is the high byte mode. The signals LOBYTE# and HIBYTE# indicating the mode of operation are each presented at one of a pair of NOR gates 52 and 53. The signal SEQDL indicating that the low bytes compare is also furnished to the NOR gate 53 while the signal SEQDH indicating that the high bytes compare is also furnished to the NOR gate 52. Low values for both of the signals LOBYTE# and HIBYTE# indicate the sixteen bit mode and that all sixteen bits must compare. A low valued signal LOBYTE# or HIBYTE# with the other signal high indicates that the low or the high byte must compare, respectively. A comparison true signal (SEQDL or SEQDH) for the particular byte causes the associated NOR gate 52 or 53 to produce a high value. These signals are inverted and furnished as low values at the input to an NAND gate 55. A pair of low values produces an output signal SEQD indicating that the comparison is verified.

If only one byte is involved (e.g., the high byte), the mode indication signal (HIBYTE# ) is low and the compare signal (SEQDH) for that byte is also low if the bits compare. This produces a high value at the output of the NOR gate (52) and a low value into the NAND gate 55. At the same time, the other mode signal (LOBYTE#) is high forcing the output of the NOR gate (53) low and the value at the input to the NAND gate 55 high. The NAND gate 55, however, produces a low valued output for the high and low input values and so masks the fact that a comparison occurred on only one byte. The same result obtains when the operation is in the low byte mode; the presence of the high value of the signal SEQDL masks the failure to compare on the high byte and produces a valid compare output. This compare output is transferred to the host to indicate that the writing has been verified.

In this manner, it will be seen that the appropriate comparisons are accomplished for ascertaining that the data programmed to the flash memory array is the same as the data stored in the array whether the amount of data is sixteen or eight bits and whether high or low eight bit values are involved.

An added facility of the circuitry illustrated is its ability to return to the proper erase state when the erase suspend operation is completed. As may be seen, the values stored in the latches 22 and 23 of the AM1 buffer automatically cause the operation to revert to a sixteen bit mode when the erase suspend operation is completed.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A memory system comprising:
a memory array which stores data, each data organized into words having a number of bits, each word further organized into a first portion and a second portion;
a plurality of input/output signal lines for the transfer of data to and from the memory array, the number of signal lines corresponding to the number of bits in a word, said input/output signal lines being divisible into a first portion and second portion of signal lines;
a plurality of buffers organized into a first portion and second portion of buffers, each buffer of the first portion coupled to an input/output signal line of the first portion of signal lines to receive at least one bit of the first portion of data, each buffer of the second portion coupled to an input/output signal line of the second portion of signal lines to receive at least one bit of the second portion of data;
a plurality of first multiplexors organized into a first portion of first multiplexors and a second portion of first multiplexors, each first multiplexor of the first portion coupled to receive at least one bit of data from the first portion of buffers, each first multiplexor of the second portion coupled to receive at least one bit of data from the first portion of buffers and at least one bit of data from the second portion of buffers;
a first control signal indicating whether a word of data is to be transferred or a portion of a word of data is to be transferred;
a second control signal indicating whether the first portion or second portion of a word of data is to be transferred when the first control signal indicates that a portion of a word of data is to be transferred;
control logic coupled to receive the first control signal and the second control signal and generate select signals to the first multiplexors to select the bits of data to be output from the first multiplexors, when said first control signal indicates that a word of data is to be transferred, said control logic generating select signals to the first portion of first multiplexors to output the first portion of data and generating select signals to the second portion of first multiplexors to output the second portion of data, when said first control signal indicates that a portion of data is to be transferred and the second control signal indicates that the first portion of data is to be transferred, said control logic generating select signals to the first portion of first multiplexors to output the first portion of data, and when said first control signal indicates that a portion of data is to be transferred and the second control signal indicates that the second portion of data is to be transferred, said control logic generating select signals to the second portion of first multiplexors to output the first portion of data.

2. The system as set forth in claim 1, wherein the second control signal is issued across a signal line of the second portion of signal lines.

3. The system as set forth in claim 1, wherein the transfer is performed to write data to the memory, said system further comprising a plurality of latches, each latch coupled to receive the output of a first multiplexor of the plurality of first multiplexors, said latch providing an output that is written into the memory, said latch further providing an output that is subsequently compared to data read from memory in order verify that data was written to the memory.

4. The system as set forth in claim 1, wherein a word is 16 bits long, said first portion of data is a lower eight bit byte of data and the second portion of data is an upper eight bit byte of data.

5. The system as set forth in claim 1, wherein said control logic further receives as input a third control signal indicating that the array erase operation is to be performed.

6. The system as set forth in claim 5, wherein each first multiplexor further receives as input an erase value, when the third control signal is received, said control logic generate a select signal to each first multiplexor to output the erase value, such that the erase values are written to the array to perform the erase operation.

7. The system as set forth in claim 6, wherein if said control logic receives a fourth signal, indicative of a erase suspend operation, during the performance of an erase operation, said control logic terminating the select signal to each first multiplexor to output the erase value and generating select signals to select the portions of data to input according to the first control signal and second control signal.

8. The system as set forth in claim 7, wherein said control logic further comprises at least one latch to store the state of the select signals output to the multiplexors, such that when an erase suspend signal is removed, the select signal to select erase values are output to continue the erase operation.

9. The system as set forth in claim 1, further comprising a plurality of second multiplexors divided into a first portion of second multiplexors coupled to the first portion of input/output signal lines and a second portion of second multiplexors coupled to the second portion of input/output signal lines, said plurality of first multiplexors outputting data to be written to the array, said plurality of second multiplexors receiving as input data read from the array, said first portion of second multiplexors receiving as input at least one bit of the first portion of data and at least one bit of the second portion of data, said second portion of second multiplexors receiving as input at least one bit of the second portion of data;

said control logic, when said first control signal indicates that a word of data is to be transferred, generating select signals to the first portion of first multiplexors to output the first portion of data and generating select signals to the second portion of first multiplexors to output the second portion of data, when said first control signal indicates that a portion of data is to be transferred and the second control signal indicates that the first portion of data is to be transferred, generating select signals to the first portion of first multiplexors to output the first portion of data, and when said first control signal indicates that a portion of data is to be transferred and the second control signal indicates that the second portion of data is to be transferred, said control logic generating select signals to the first portion of first multiplexors to output the second portion of data.

10. A computer system comprising:
- a bus comprising a plurality of signal lines for the transfer of data, the number of signal lines corresponding to the number of bits in a word, said input/output signal lines being divisible into a first portion and second portion of signal lines;
- a processor coupled to the bus;
- a memory system coupled to the bus to transfer data read from the memory system to the processor and transfer data from the processor to be written to the memory system, said memory system comprising;
  - a memory array which stores data, each data organized into words having a number of bits, each word further organized into a first portion and a second portion;
  - a plurality of buffers organized into an first portion and second portion of buffers, each buffer of the first portion coupled to an signal line of the first portion of signal lines to receive at least one bit of the first portion of data, each buffer of the second portion coupled to an signal line of the second portion of signal lines to receive at least one bit of the second portion of data;
  - a plurality of first multiplexors organized into a first portion of first multiplexors and a second portion of first multiplexors, each first multiplexor of the first portion coupled to receive at least one bit of data from the first portion of buffers, each first multiplexor of the second portion coupled to receive at least one bit of data from the first portion of buffers and at least one bit of data from the second portion of buffers;
  - a first control signal indicating whether a word of data is to be transferred or a portion of a word of data is to be transferred;
  - a second control signal indicating whether the first portion or second portion of data is to be transferred when the first control signal indicates that a portion of a word of data is to be transferred;
  - control logic coupled to receive the first control signal and the second control signal and generate select signals to the first multiplexors to select the bits of data to be output from the first multiplexors, when said first control signal indicates that a word of data is to be transferred, said control logic generating select signals to the first portion of first multiplexors to output the first portion of data and generating select signals to the second portion of first multiplexors to output the second portion of data, when said first control signal indicates that a portion of data is to be transferred and the second control signal indicates that the first portion of data is to be transferred, said control logic generating select signals to the first portion of first multiplexors to output the first portion of data, and when said first control signal indicates that a portion of data is to be transferred and the second control signal indicates that the second portion of data is to be transferred, said control logic generating select signals to the second portion of first multiplexors to output the first portion of data.

11. The computer system as set forth in claim 10, wherein the second control signal is issued across a signal line of the second portion of signal lines.

12. The computer system as set forth in claim 10, wherein the first control signal and second control signal are issued to the memory system by the processor.

13. The computer system as set forth in claim 10, wherein the transfer is performed to write data to the memory, said memory system further comprising a plurality of latches, each latch coupled to receive the output of a first multiplexor of the plurality of first multiplexors, said latch providing an output that is written into the memory, said latch further providing an output that is subsequently compared to data read from memory in order to verify that data was written to the memory.

14. The computer system as set forth in claim 10, wherein a word is 16 bits long, said first portion of data is a lower eight bit byte of data and the second portion of data is an upper eight bit byte of data.

15. The computer system as set forth in claim 10, wherein said control logic further receives as input a third control signal issued by the processor indicating that the memory array erase operation is to be performed.

16. The computer system as set forth in claim 15, wherein each first multiplexor further receives as input an erase value, when the third control signal is received, said control logic generate a select signal to each first multiplexor to output the erase value, such that the erase values are written to the memory array to perform the erase operation.

17. The computer system as set forth in claim 16, wherein if said control logic receives a fourth signal, indicative of a erase suspend operation, during the performance of an erase operation, said control logic terminating the select signal to each first multiplexor to output the erase value and generating select signals to select the portions of data to input according to the first control signal and second control signal.

18. The computer system as set forth in claim 17, wherein said control logic further comprises at least one latch to store the state of the select signals output to the multiplexors, such that when an erase suspend signal is removed, the select signal to select erase values are output to continue the erase operation.

19. The computer system as set forth in claim 10, further comprising a plurality of second multiplexors divided into a first portion of second multiplexors coupled to the first portion of signal lines and a second portion of second multiplexors coupled to the second portion of signal lines, said plurality of first multiplexors outputting data to be written to the array, said plurality of second multiplexors receiving as input data read from the array, said first portion of second multiplexors receiving as input at least one bit of the first portion of data and at least one bit of the second portion of data, said second portion of second multiplexors receiving as input at least one bit of the second portion of data;

said control logic, when said first control signal indicates that a word of data is to be transferred, generating select signals to the first portion of first multiplexors to output the first portion of data and generating select signals to the second portion of first multiplexors to output the second portion of data, when said first control signal indicates that a portion of data is to be transferred and the second control signal indicates that the first portion of data is to be transferred, generating select signals to the first portion of first multiplexors to output the first portion of data, and when said first control signal indicates that a portion of data is to be transferred and the second control signal indicates that the second portion of data is to be transferred, said control logic generating select signals to the first portion of first multiplexors to output the second portion of data.

20. A memory system comprising:

a memory array which stores data, each data organized into words having a number of bits, each word further organized into a first portion and a second portion;

a plurality of means for transfer of data to and from the memory array, the number of means for transfer corresponding to the number of bits in a word, said means for transfer being divisible into a first portion and second portion;

a plurality of buffer means organized into a first portion and second portion of buffer means, each buffer means of the first portion coupled to a means for transfer of the first portion of means for transfer to receive at least one bit of the first portion of data, each buffer means of the second portion coupled to a means for transfer of the second portion of the means for transfer to receive at least one bit of the second portion of data;

a plurality of first multiplexing means organized into a first portion of first multiplexing means and a second portion of first multiplexing means, each first multiplexing means of the first portion coupled to receive at least one bit of data from the first portion of buffer means, each first multiplexing means of the second portion coupled to receive at least one bit of data from the first portion of buffer means and at least one bit of data from the second portion of the buffer means;

a first signal means to generate a first signal indicating whether a word of data is to be transferred or a portion of a word of data is to be transferred;

a second signal means to generate a second signal indicating whether the first portion or second portion of data is to be transferred when the first signal means indicates that a portion of a word of data is to be transferred;

control means coupled to receive the first signal and the second signal and generate select signals to the first multiplexors to select the bits of data to be output from the first multiplexors, when said first signal means indicates that a word of data is to be transferred, said control means generating select signals to the first portion of first multiplexing means to output the first portion of data and generating select signals to the second portion of first multiplexing means to output the second portion of data, when said first signal indicates that a portion of data is to be transferred and the second signal indicates that the first portion of data is to be transferred, said control means generating select signals to the first portion of first multiplexing means to output the first portion of data, and when said first signal indicates that a portion of data is to be transferred and the second signal indicates that the second portion of data is to be transferred, said control means generating select signals to the second portion of first multiplexing means to output the first portion of data.

21. The system as set forth in claim 20, wherein the second signal means issues the second signal across a means for transfer of the second portion of the means for transfer.

22. The system as set forth in claim 20, wherein the transfer is performed to write data to the memory, said system further comprising a plurality of latching means, each latching means coupled to receive the output of a first multiplexing means of the plurality of first multiplexing means, said latching means providing an output that is written into the memory, said latching means further providing an output that is subsequently compared to data read from memory in order to verify that data was written to the memory.

23. The system as set forth in claim 20, wherein a word is 16 bits long, said first portion of data is a lower eight bit byte of data and the second portion of data is an upper eight bit byte of data.

24. The system as set forth in claim 20, further comprising a third signal means to generate a third signal to the control means to indicate that an array erase operation is to be performed.

25. The system as set forth in claim 24, wherein each first multiplexing means further receives as input an erase value, when the third control signal is received, said control logic generate a select signal to each first multiplexing means to output the erase value, such that the erase values are written to the array to perform the erase operation.

26. The system as set forth in claim 25, further comprising a fourth means for generating an erase suspend signal wherein if said control means receives the erase suspend signal during the performance of an erase operation, said control means terminating the select signal to each first multiplexing means to output the erase value and generating select signals to select the portions of data to input according to the first signal and second signal.

27. The system as set forth in claim 26, wherein said control means further comprises at least one latching means to store the state of the select signals output to the multiplexing means, such that when an erase suspend signal is terminated, the select signal to select erase values are output to continue the erase operation.

28. The system as set forth in claim 20, further comprising a plurality of second multiplexing means divided into a first portion of second multiplexing means coupled to the first portion of input/output signal lines and a second portion of second multiplexing means coupled to the second portion of input/output signal lines, said plurality of first multiplexing means outputting data to be written to the array, said plurality of second multiplexing means receiving as input data read from the array, said first portion of second multiplexing means receiving as input at least one bit of the first portion of data and at least one bit of the second portion of data, said second portion of second multiplexing means receiving as input at least one bit of the second portion of data;

said control means, when said first signal indicates that a word of data is to be transferred, generating select signals to the first portion of first multiplexing means to output the first portion of data and generating select signals to the second portion of first multiplexing means to output the second portion of data, when said first signal indicates that a portion of data is to be transferred and the second signal indicates that the first portion of data is to be transferred, generating select signals to the first portion of first multiplexing means to output the first portion of data, and when said first signal indicates that a portion of data is to be transferred and the second control signal indicates that the second portion of data is to be transferred, said control means generating select signals to the first portion of first multiplexing means to output the second portion of data.

29. In a memory system comprising a memory array which stores data, each data organized into words having a number of bits, each word further organized into a first portion and a second portion and a plurality of signal lines for the transfer of data to and from the memory array, the number of signal lines corresponding to the number of bits in a word, a method for transferring data between the memory array and the signal lines is a first mode in which a word is transferred, in a second mode when the first portion of the word is transferred and a third mode in which the second portion of the word is transferred, said method comprising the steps of:

dividing said signal lines being a first portion and second portion of signal lines;

coupling a plurality of buffers to the signal lines such that the plurality of buffers are divisible as a first portion of buffers and a second portion of buffers and receive at least one bit of data from the signal lines;

receiving at least one bit of data from the signal lines into the buffers;

issuing a first signal indicating whether a word of data is to be transferred or a portion of a word of data is to be transferred;

issuing a second signal if the first signal indicates that a portion of a word of data is to be transferred, said second signal indicating whether the first portion or second portion of data is to be transferred;

outputting the data from the buffers to a plurality of multiplexors organized into a first portion of first multiplexors and a second portion of first multiplexors, when said first signal indicates that a word of data is to be transferred, outputting the first portion of data to the first portion of first multiplexors and outputting the second portion of data to the second portion of first multiplexors, when said first signal indicates that a portion of data is to be transferred and the second signal indicates that the first portion of data is to be transferred, outputting the first portion of data to the first portion of first multiplexors, and when said first signal indicates that a portion of data is to be transferred and the second signal indicates that the second portion of data is to be transferred, outputting the first portion of data to the second portion of first multiplexors.

* * * * *

UNITED STATES PATENT AND TRADEMARK OFFICE
CERTIFICATE OF CORRECTION

PATENT NO. : 5,379,413
DATED : January 3, 1995
INVENTOR(S) : Hazen et al.

It is certified that error appears in the above-indentified patent and that said Letters Patent is hereby corrected as shown below:

In column 4 at line 27 delete "the," and insert --the--

In column 6 at lines 28-29 delete "multi-plexor" and insert --multiplexors--

Signed and Sealed this

Twelfth Day of November, 1996

Attest:

BRUCE LEHMAN

*Attesting Officer*  *Commissioner of Patents and Trademarks*